(12) United States Patent
Pavio

(10) Patent No.: US 7,335,534 B2
(45) Date of Patent: Feb. 26, 2008

(54) SEMICONDUCTOR COMPONENT AND METHOD OF MANUFACTURE

(75) Inventor: Jeanne S. Pavio, Paradise Valley, AZ (US)

(73) Assignee: HVVI, Semiconductors, Inc., Phoenix, AZ (US)

(*) Notice: Subject to any disclaimer, the term of this patent is extended or adjusted under 35 U.S.C. 154(b) by 210 days.

(21) Appl. No.: 11/327,552

(22) Filed: Jan. 6, 2006

(65) Prior Publication Data
US 2006/0189038 A1   Aug. 24, 2006

(51) Int. Cl.
H01L 21/50 (2006.01)
H01L 23/495 (2006.01)
H01L 23/34 (2006.01)

(52) U.S. Cl. .............. 438/122; 438/123; 257/675; 257/712; 257/E23.08; 257/E21.499

(58) Field of Classification Search ........ 257/E23.031, 257/E23.08, E23.086, E21.499, E21.506
See application file for complete search history.

(56) References Cited

U.S. PATENT DOCUMENTS

| | | | |
|---|---|---|---|
| 5,008,736 A | 4/1991 | Davies et al. | |
| 5,049,055 A | 9/1991 | Yokoyama | |
| 5,175,007 A | 12/1992 | Elliott | |
| 5,556,647 A | 9/1996 | Abe et al. | |
| 6,455,925 B1 | 9/2002 | Laureanti | 257/678 |
| 6,566,749 B1 | 5/2003 | Joshi et al. | 257/706 |
| 6,586,833 B2 | 7/2003 | Baliga | 257/712 |
| 6,617,686 B2 | 9/2003 | Davies | 257/725 |
| 6,649,975 B2 | 11/2003 | Baliga | 257/330 |
| 6,653,691 B2 | 11/2003 | Baliga | 257/390 |
| 6,674,157 B2 | 1/2004 | Lang | 257/678 |
| 6,727,117 B1 | 4/2004 | McCoy | 438/106 |
| 6,784,366 B1 | 8/2004 | Boucher et al. | |
| 6,791,438 B2 | 9/2004 | Takahashi et al. | |

FOREIGN PATENT DOCUMENTS

WO   WO 2005/069378 A2   7/2005

OTHER PUBLICATIONS

U.S. Appl. No. 11/387,617, filed Mar. 23, 2006, Davies, Robert Bruce; Seely, Warren Leroy; and Pavio, Jeanne S.
Adamson, Philip; Lead-Free Packaging for Discrete Power Semiconductors; International Rectifier, 2002 JEDEC Conference; Apr./May 2002.

(Continued)

Primary Examiner—Scott B. Geyer
(74) Attorney, Agent, or Firm—Anthony M. Martinez

(57) ABSTRACT

A semiconductor component having a semiconductor chip mounted on a packaging substrate and a method for manufacturing the semiconductor component that uses batch processing steps for fabricating the packaging substrate. A heatsink is formed using an injection molding process. The heatsink has a front surface for mating with a semiconductor chip and a leadframe assembly. The heatsink also has a back surface from which a plurality of fins extend. The leadframe assembly includes a leadframe having leadframe leads extending from opposing sides of the leadframe to a central area of the leadframe. A liquid crystal polymer is disposed in a ring-shaped pattern on the leadframe leads. The liquid crystal polymer is partially cured. The leadframe assembly is mounted on the front surface of the heatsink and the liquid crystal polymer is further cured to form a packaging assembly, which is then singulated into packaging substrates.

44 Claims, 6 Drawing Sheets

OTHER PUBLICATIONS

Bussarakons, Tiva; New Materials and Technologies Solve Hermetic SMD Integration; International Rectifier as appeared in PCIM Power Electronic Systems Magazine, Dec. 1999, pp. 1-5.

Haque, Shatil, "Packaging of Metal Post Interconnected Parallel Plate Structure (MPIPPS) Modules," Chapter II, Dissertation: *Processing and Characterization of Device Solder Interconnection and Module for Power Electronics Modules* (Dec. 1999).

Juhel, S. and Hamelin, N.; AN1294, Application Note, PowerSO-10RF: The First True RF Power SMD Package, Feb. 2001, pp. 1-12.

Mahalingam, Mali; McCloskey, Mike; and Viswanathan, Vish; Freescale Semiconductor, Inc.; Low Rth Device Packaging for High Power RF LDMOS Transistors for Cellular and 3G Base Station Use, © Motorola, Inc. 2003.

Nokia Research Center and Freescale Semiconductor; Novel Material for Improved Quality of RF-PA in Base-Station Applications; Presented at 10th International Worship on Thermal Investigation of ICSs and Systems; Sep. 29-Oct. 1, 2004.

Prophet, Graham; Power FETs Find Their Place; EDN; Apr. 17, 2003, pp. 43-50.

Sawle, Andrew; Standing, Martin; Sammon, Tim; & Woodworth, Arthur; DirectFET A Proprietary New Source Mounted Power Package for Board Mounted Power, PCIM Europe 2001; International Rectifier, Oxted, Surrey, England.

US 7,335,534 B2

SEMICONDUCTOR COMPONENT AND METHOD OF MANUFACTURE

FIELD OF THE INVENTION

The present invention relates, in general, to a semiconductor component and, more particularly, to a semiconductor component package.

BACKGROUND OF THE INVENTION

Semiconductor component manufacturers are constantly striving to increase the performance of their products, while decreasing their cost of manufacture. A cost intensive area in the manufacture of semiconductor components is packaging the semiconductor chips that contain the semiconductor devices. As those skilled in the art are aware, discrete semiconductor devices and integrated circuits are fabricated in wafers, which are then singulated or diced to produce semiconductor chips. One or more semiconductor chips are placed in a package to protect them from environmental and physical stresses.

Packaging semiconductor chips increases the cost and complexity of manufacturing semiconductor components because the packaging designs must not only provide protection, they must also permit transmission of electrical signals to and from the semiconductor chips and removal of heat generated by the semiconductor chip.

Accordingly, it would be advantageous to have a semiconductor package for dissipating heat from a semiconductor chip and a method for manufacturing the semiconductor package that is cost and time efficient.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Figure 1:
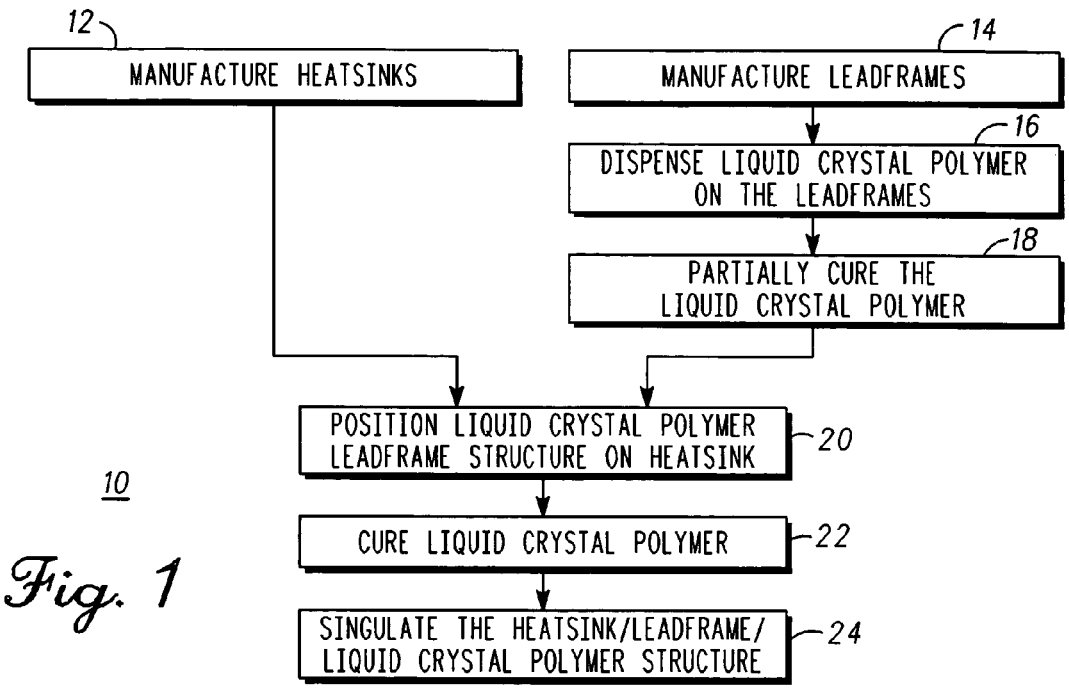
FIG. 1 is a flow diagram for manufacturing a semiconductor component package in accordance with an embodiment of the present invention.

FIG. 1 is a flow diagram 10 for manufacturing a semiconductor component package in accordance with an embodiment of the present invention. In a beginning step (reference number 12), a plurality of heatsinks are manufactured using, for example, an injection mold batch process. Typically, each heatsink of the plurality of heatsinks has a quadrilateral shape. It should be understood that the shaped of each heatsink is not a limitation of the present invention. As those skilled in the art are aware, injection molding technology allows for the manufacture of heatsinks having various shapes and dimensions. In another beginning step (reference number 14), a leadframe having a plurality of leadframe leads is provided. By way of example, the leadframe is configured to have a plurality of sets of leadframe leads, where one set is associated with a single or corresponding heatsink. In one embodiment, each set is comprised of two leadframe leads that are spaced apart from each other and are for coupling to opposing sides of the quadrilaterally shaped heatsink using a liquid crystal polymer. The liquid crystal polymer is dispensed or extruded on the leadframe to form a plurality of square shaped rings of polymeric material. One of the square shaped rings corresponds to a set of the leadframe leads, wherein one side of the square shaped ring of polymer is on one leadframe lead and an opposite side of the square shaped ring of polymer is on the other leadframe lead of a set two leadframe leads (reference number 16). Leadframe leads having liquid crystal polymer disposed thereon are further described with reference to FIG. 3.

In accordance with one embodiment, after dispensing the liquid crystal material on the leadframe leads, it is partially cured (reference number 18) by exposing it to heat at a temperature ranging from about 260° C. to about 280° C. for a time period ranging from about 20 minutes to about 60 minutes under low pressure. A low pressure is a pressure of less than 1,000 pounds per square inch (psi), or less than 6895 kiloPascals (kPa). By way of example, the liquid crystal polymer is partially cured at a pressure of about 100 psi (i.e., about 689 kPa). The partial curing step sufficiently solidifies the liquid crystal material so that it maintains its form while making the liquid crystal polymer tacky or sticky.

The liquid crystal material is positioned on or mated with the heatsinks (reference number 20). Because the partial curing step makes the liquid crystal polymer tacky, it sticks to the heatsink, thereby coupling the leadframe leads to the heatsink. Preferably, mating the liquid crystal material with the heatsinks occurs while the heatsinks are still positioned in the molds in which they were cast.

The leadframe leads and heatsinks are pressed together by applying pressure to one or both of them and the liquid crystal material is fully cured (reference number 22) by exposing it to heat at a temperature ranging from about 280° C. to about 300° C. for a time period ranging from about 20 minutes to about 60 minutes under low pressure, e.g., about 100 psi (i.e., about 689 kPa). After fully curing the liquid crystal polymer, the plurality of heatsinks, leadframe leads, and liquid crystal polymer form a unitary packaging structure comprising a plurality of packaging substrates. The unitary packaging structure is singulated into individual packaging substrates using, for example, sawing or laser cutting (reference number 24).

Figure 2:
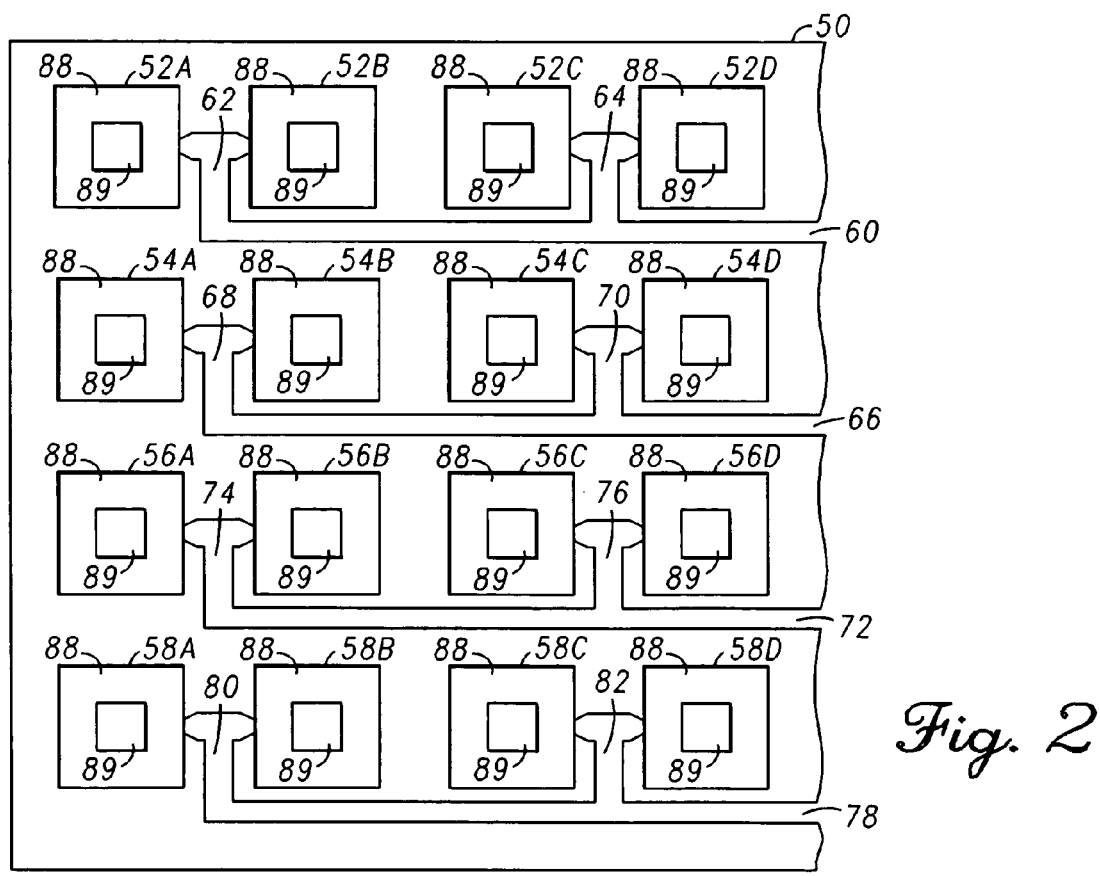
FIG. 2 is a top view of a heatsink in accordance with an embodiment of the present invention.

FIG. 2 is a top view of a bottom portion 50 of a mold assembly for forming heatsinks. It should be understood that the mold assembly comprises top and bottom portions that are clamped together to form mold cavities into which a heatsink material such as, for example, copper, is injected to form the heatsinks. Bottom portion 50 comprises a plurality of cavities 52A-52D, 54A-54D, 56A-56D, and 58A-58D for forming heatsinks. A runner 60 having feeder lines 62 and 64 is coupled to cavities 52A-52D. Feeder line 62 couples runner 60 to cavities 52A and 52B and feeder line 64 couples runner 60 to cavities 52C and 52D. A runner 66 having feeder lines 68 and 70 is coupled to cavities 54A-54D. Feeder line 68 couples runner 66 to cavities 54A and 54B and feeder line 70 couples runner 66 to cavities 54C and 54D. A runner 72 having feeder lines 74 and 76 is coupled to cavities 56A-56D. Feeder line 74 couples runner 72 to cavities 56A and 56B and feeder line 76 couples runner 72 to cavities 56C and 56D. A runner 78 having feeder lines 80 and 82 is coupled to cavities 58A-58D. Feeder line 80 couples runner 78 to cavities 58A and 58B and feeder line 82 couples runner 78 to cavities 58C and 58D. After clamping a top portion (not shown) of a mold assembly with bottom portion 50 and injecting the heatsink material into the mold assembly, heatsinks 88 are formed. Techniques for forming heatsinks using processes such as injection molding are known to those skilled in the art.

After forming heatsinks 88, the top portion of the mold assembly is removed and a heatsink 88 having a platform 89 remains in each of cavities 52A-52D, 54A-54D, 56A-56D, and 58A-58D. It should be noted that platform 89 is an optional feature of heatsink 88 and is formed by including a cavity in the top portion (not shown) of the mold assembly.

Figure 3:
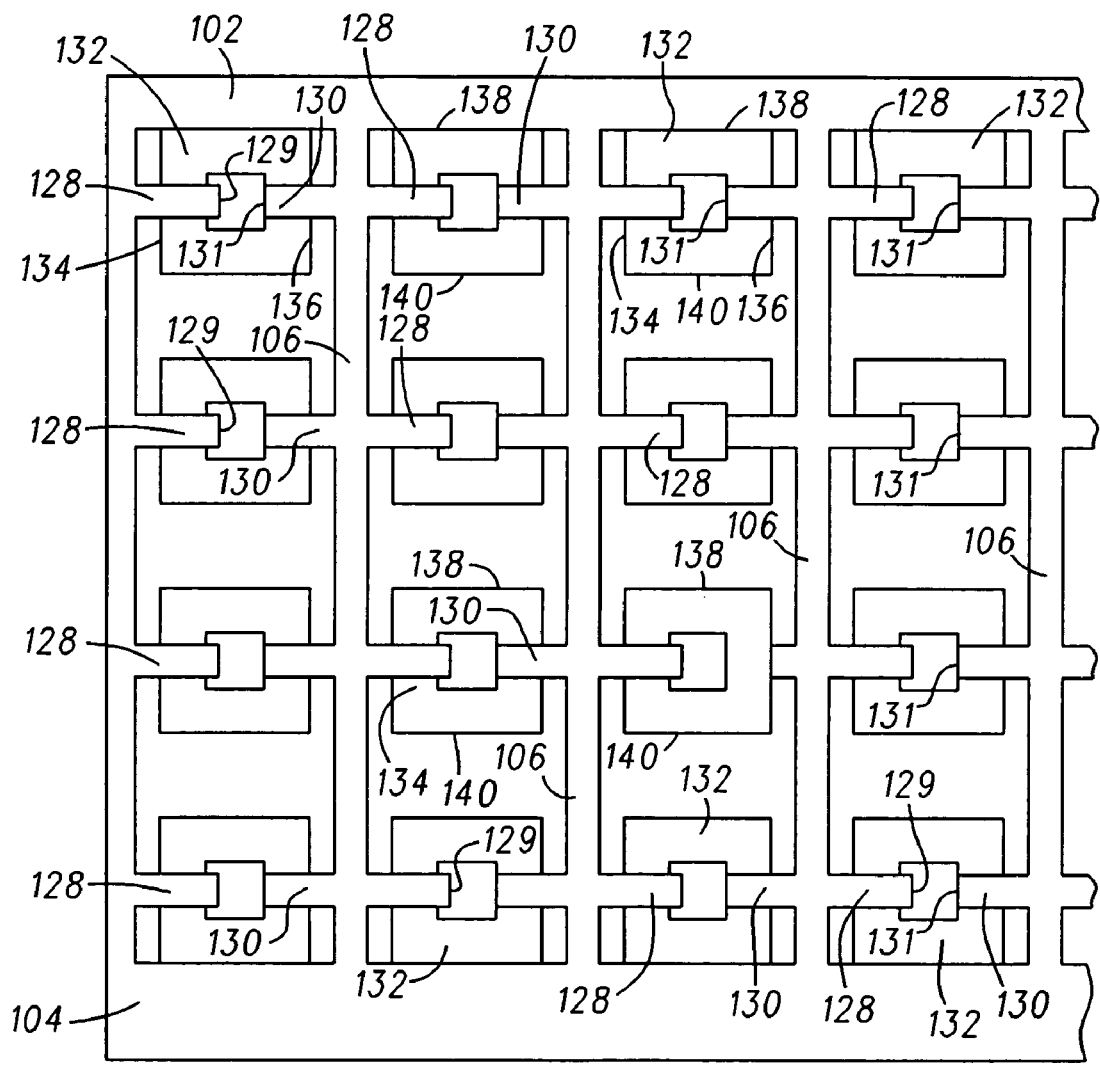
FIG. 3 is a top view of a leadframe over annular or ring-shaped regions of liquid crystal polymer in accordance with an embodiment of the present invention.

Referring now to FIG. 3, a top view of a leadframe 100 over annular or ring-shaped regions 132 of liquid crystal polymer is illustrated. Leadframe 100 has a rail 102 coupled to a rail 104 by a plurality of ribs 106 which are substantially perpendicular to rails 102 and 104. Each rib 106 has a plurality of leadframe leads 128 and 130 that extend from and are perpendicular to ribs 106. Leadframe 100 is configured such that a lead 128 and a lead 130 form a pair of leads extending in opposite directions from a common portion of rib 106. In accordance with one embodiment of the present invention, each rib 128 is longer than each rib 130. Preferably leadframe 100 is a copper leadframe. Other suitable materials for leadframe 100 include iron nickel alloys. Techniques for manufacturing leadframes are known to those skilled in the art.

A liquid crystal polymer is dispensed in annular or ring-shaped patterns to form a plurality of ring-shaped dielectric structures 132 over portions of a bottom side of leadframe 100. Ring-shaped dielectric structures 132 are thermally conductive, but electrically non-conductive. More particularly, each ring-shaped dielectric structure is a quadrilateral structure having opposing walls 134 and 136 and opposing walls 138 and 140. The portion of the liquid crystal polymer forming wall 134 is disposed on a central portion of leadframe lead 128, i.e., the liquid crystal polymer is spaced apart from an end 129 of leadframe lead 128. The portion of the liquid crystal polymer forming wall 136 is disposed adjacent an end 131 of leadframe lead 130. Preferably, end 131 of leadframe lead 130 is aligned with an edge of wall 136. However, the positioning of wall 136 on leadframe leads 128 and 130 are not limitations of the present invention. The liquid crystal polymer is partially cured by exposing it to heat at a temperature ranging from about 260° C. to about 280° C. for a time period ranging from about 20 minutes to about 60 minutes under low pressure, e.g., 100 psi (i.e., about 689 kPa). As described with reference to FIG. 1, the partial curing step sufficiently solidifies the liquid crystal material so that it maintains its form and makes it tacky or sticky.

Figure 4:
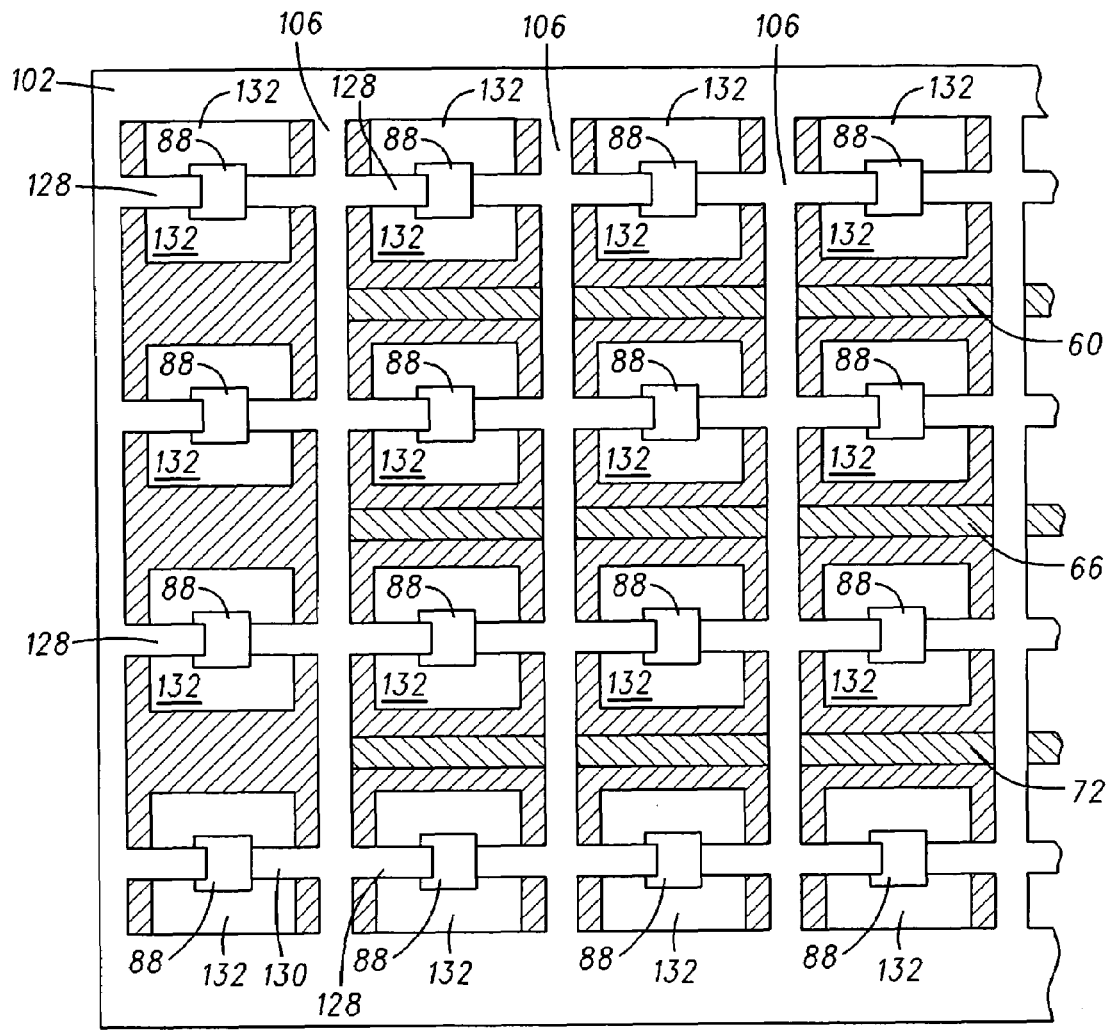
FIG. 4 is a top view of the leadframe of FIG. 2 coupled with a heatsink prior to singulation.

Referring now to FIG. 4, leadframe 100 having the liquid crystal polymer disposed thereon is mated with heatsinks 88. What is shown in FIG. 4 are heatsinks 88 positioned in bottom portion 50 of the mold assembly and leadframe 100 coupled to the plurality of heat sinks 88. For the sake of clarity, the exposed portions of bottom portion 50 of the mold assembly and runners 60, 66, and 72 are cross-hatched, wherein the cross-hatches for bottom portion 50 rise from left to right and the cross-hatches for runners 60, 66, and 72, rise from right to left, i.e., the cross-hatches are in different directions. Pressure is applied to either the leadframe, the heatsink, or both, and the liquid crystal polymer is cured by, for example, being heated to a temperature ranging from about 280° C. to about 300° C. for a time period ranging from about 20 minutes to about 60 minutes under low pressure, e.g., 100 psi (i.e., about 689 kPa). Curing the assembly forms a packaging structure or packaging frame 140, i.e., the combination of leadframe 100, liquid crystal polymer 132, and heatsinks 88.

Figure 5:
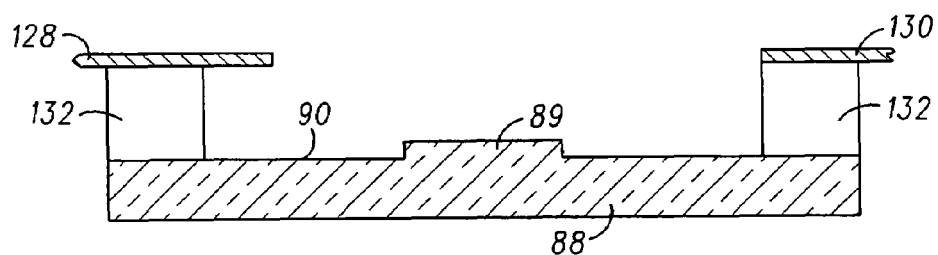
FIG. 5 is a cross-sectional side view of a singulated semiconductor packaging substrate in accordance with an embodiment of the present invention.

Referring now to FIG. 5, packaging structure 140 is singulated by, for example, sawing or laser trimming, to form individual packaging substrates 142. What is shown in FIG. 5 is a cross-sectional side view of a singulated packaging substrate 142. Each singulated packaging substrate 142 comprises leadframe leads 128 and 130 coupled to a heatsink 88 through a ring-shaped liquid crystal polymer structure 132. Optionally, heatsink 88 has a platform 89 that extends about 30 mils above major surface 90 and serves as a chip receiving area.

Figure 6:
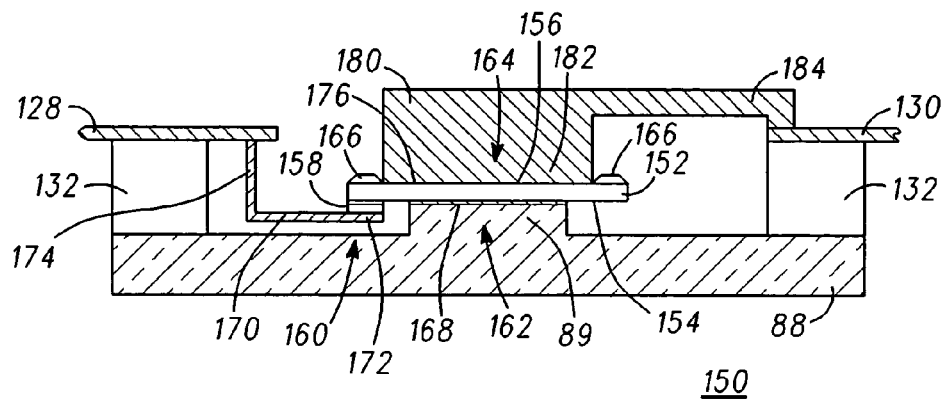
FIG. 6 is a cross-sectional side view of a semiconductor component including a semiconductor chip coupled to the singulated semiconductor packaging substrate of FIG. 5 in accordance with an embodiment of the present invention.

FIG. 6 is a cross-sectional side view of a semiconductor component 150 having a semiconductor chip 152 mounted to platform 89 in accordance with an embodiment of the present invention. What is shown in FIG. 6 is a singulated packaging substrate 142 as described with reference to FIG. 5 having semiconductor chip 152 mounted thereon. Semiconductor chip 152 has opposing surfaces 154 and 156 and is joined with platform 89 of singulated packaging substrate 142. In accordance with one embodiment, semiconductor chip 152 is a Radio Frequency (RF) power transistor in which a gate structure 158 is formed on a peripheral portion 160 of semiconductor chip 152 and a source region 162 is formed from a central portion of semiconductor chip 152. Gate structure 158 comprises a gate dielectric disposed on surface 154 and a gate conductor disposed on the gate dielectric. A contact 168 is formed on source region 162. Suitable metallization systems for contact 168 include a titanium-nickel-gold alloy or a titanium-nickel silver alloy. Contact 168 is soldered to platform 89. An end 172 of a microstrip line 170 is soldered to gate structure 158 and an opposing end 174 of microstrip line 170 is soldered to leadframe lead 128. Suitable materials for microstrip line 170 include gold plating on a ceramic substrate, gold plating over metal on a liquid crystal polymer substrate, or the like. Although gate structure 158 is described as being coupled to leadframe lead 128 by bonding a microstrip line 170 to its bottom surface, this is not a limitation of the present invention. For example, gate structure 158 can be coupled either to the top or bottom of leadframe lead 128 by an electrically conductive clip or the like. Preferably, the means for coupling gate structure 158 to leadframe lead 128 matches the impedance at gate structure 158 to reduce reflections of the electrical signal.

A central portion of surface 156 serves as a drain 164 of RF power transistor 152. Optionally, the central portion of semiconductor chip 152 is thinned from surface 156 into semiconductor chip 152 during wafer processing, thereby forming a lip 166 along the periphery of surface 156. Thinning the central portion of semiconductor chip 152 improves the transfer of heat away from semiconductor chip 152, but makes it more fragile. Forming lip 166 from back surface 156 increases the structural integrity of semiconductor chip 152. A contact 176 is formed on drain region 164. Suitable metallization systems for contact 176 include an aluminum layer having a nickel-gold alloy disposed thereon or an aluminum layer having a nickel-silver alloy disposed thereon.

An end 182 of a clip 180 is soldered to drain contact 176 and an end 184 of clip 180 is soldered to leadframe lead 130. By way of example, clip 180 comprises a copper-tungsten alloy. The means for coupling leadframe lead 130 to drain contact 176 is not limited to being a clip. For example, the coupling means includes a solder connection, wirebonding techniques, lead bonding techniques, or the like.

Figure 7:
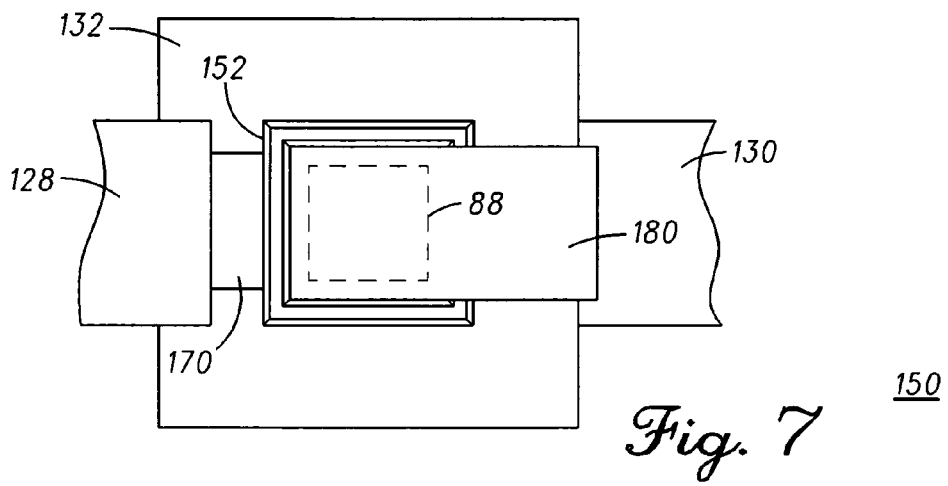
FIG. 7 is a top view of the semiconductor component of FIG. 6.

Briefly referring to FIG. 7, a top view of semiconductor component 150 is illustrated. What is shown in FIG. 7 is leadframe leads 128 and 130 coupled to square-shaped heatsink 88 through ring-shaped dielectric structure 132. Semiconductor chip 152 is soldered to platform 89 (shown in FIG. 6) and gate structure 158 is electrically coupled to leadframe lead 128 by microstrip line 170. Drain contact 176 is coupled to leadframe lead 130 by clip 180.

Figure 8:
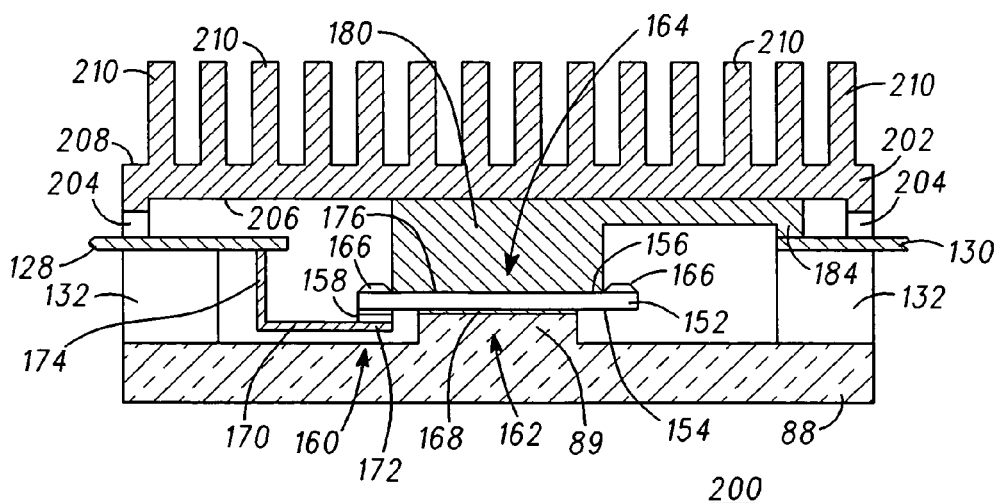
FIG. 8 is a cross-sectional side view of the semiconductor component of FIG. 6 having a lid mounted thereon.

Referring now to FIG. 8, a cross-sectional side view of a semiconductor component 200 comprising a component 150 (shown in FIGS. 6 and 7) having a lid 202 in accordance with another embodiment of the present invention is shown. An adhesive material 204 such as, for example, an epoxy adhesive, is dispensed on the exposed portions of ring-shaped dielectric structure 132 and the portions of leadframes 128 and 130 over ring-shaped dielectric structure 132. Lid 202 has opposing surfaces 206 and 208 and is bonded to component 150 through adhesive material 204. Optionally, lid 202 has a plurality of fins 210 extending from surface 208. Lid 202 and fins 210 may be formed as a unitary structure using a molding technique. Suitable materials for lid 202 include aluminum nitride, copper, aluminum, metal matrix composite material, silicon carbide, or the like. It should be understood that the structure of fins 210 is not a limitation of the present invention. Fins 210 may be comprised of a plurality of rectangular shaped extensions protruding from surface 208, a plurality of pin-like structures protruding from surface 208, a plurality of pyramidal-shaped structures protruding from surface 208, or the like.

Figure 9:
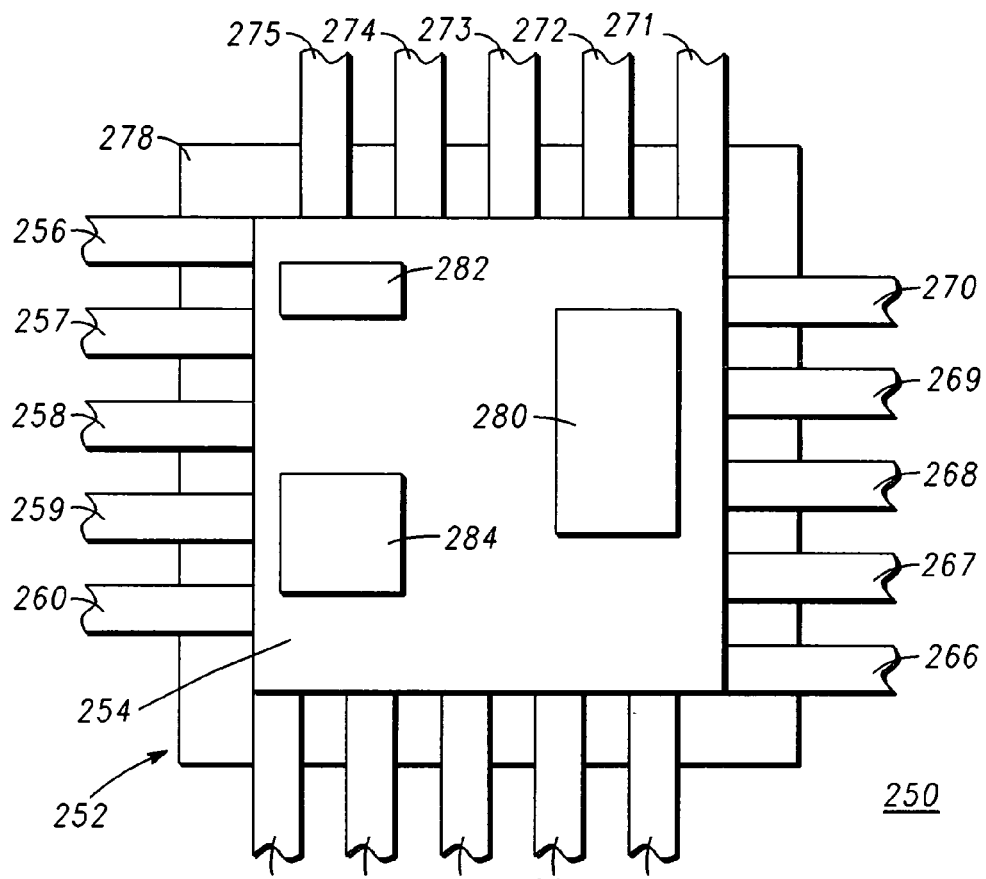
FIG. 9 is a top view of a semiconductor component in accordance with another embodiment of the present invention.

FIG. 9 illustrates a top view of a semiconductor component 250 comprising a packaging substrate 252 on which a plurality of semiconductor chips are mounted. The plurality of semiconductor chips communicate with each other, thereby forming a system-in-a-package. Packaging substrate 252 is similar to packaging substrate 142 described with reference to FIGS. 2-5; however, it has a plurality of semiconductor chips disposed thereon and a plurality of leads extending from each side rather than a single lead extending from each of two opposing sides of the heatsink. Thus, the steps for manufacturing packaging substrate 252 are similar to those for manufacturing packaging substrate 142, except that a plurality of leads are coupled to each side of the heatsink through the liquid crystal polymer. In addition, a platform such as platform 89 may be on a different portion of the heatsink or platform 89 may be absent from the heatsink. Packaging substrate 252 includes a heatsink 254 having a quadrilateral shape that may be formed using a mold assembly and process similar to the mold assembly and process described with reference to FIG. 2.

A leadframe having leads on which liquid crystal polymer is dispensed in an annular or ring-shaped pattern is provided. The leadframe on which the liquid crystal polymer is dispensed is similar to leadframe 100 described with reference to FIG. 3, except that the leadframe has five leadframe leads extending from each side rather than a single leadframe lead extending from each of two opposing sides. Leadframe leads 256-260 and 266-270 extend from opposing sides of the leadframe and leadframe leads 261-265 and 271-275 extend from opposing sides of the leadframe. Briefly referring to FIG. 3, leadframe 100 has two leadframe leads extending from opposing sides at each location having leadframe leads. It should be understood that the number of leadframe leads is not a limitation of the present invention. In other words, there may be more than five leadframe leads extending from each side or fewer than five leadframe leads extending from each side. What's more, the number of leads extending from each leadframe side do not have to be the same. Thus, for example, a quadrilaterally shaped heatsink may have one side with three leadframe leads, two sides with four leadframe leads, and the fourth side with five leadframe leads.

Referring again to FIG. 9, the liquid crystal polymer forms a ring-shaped dielectric structure such as structure 278 over the bottom side of leadframe leads 256-275. Although leadframe leads 256-275 are shown as not extending over the edges of ring-shaped dielectric structure 278 and into its central portion, this is not a limitation of the present invention. It may be desirable for one or more of the ends of leadframe leads 256-275 to extend over the edges of ring-shaped dielectric structure 278 similar to leadframe leads 128 described with reference to FIG. 5. Like packaging substrate 142, the liquid crystal polymer of ring-shaped dielectric structure 278 is partially cured at a temperature ranging from about 260° C. to about 280° C. for a time ranging from about 20 minutes to about 60 minutes. Leadframe leads 256-275 and ring-shaped dielectric polymer structure 278 are mounted to heatsink 254. After mounting, the liquid crystal polymer of dielectric structure 278 is cured at a temperature ranging from about 280° C. to about 300° C. for a time ranging from about 20 minutes to about 60 minutes under low pressure, e.g., about 100 psi (689 kPa).

In accordance with one embodiment, the plurality of semiconductor chips mounted to heatsink 254 include an RF power transistor 280, a switching device 282, and a mixed signal integrated circuit 284. The backside or non-active side of each chip may be electrically coupled to heatsink 254 or the backsides of semiconductor chips 280, 282, and 284 may be coupled to heatsink 254 through an insulating material such as, for example, liquid crystal polymer. Leadframe leads 256-275 are coupled to portions of semiconductor chips 280, 282, and 284 using, for example, wirebonds or clips. It should be understood that the choice of which leadframe leads 256-275 to couple to a semiconductor chip and to which bond pads (not shown) on the semiconductor chip is a design choice. It should be further understood that the chips may be coupled to each other by, for example, wirebonding. For the sake of clarity, the wirebonds have not been shown in FIG. 9.

Optionally, a lid such as, for example, lid 202, can be mounted on packaging substrate 250.

Figure 10:
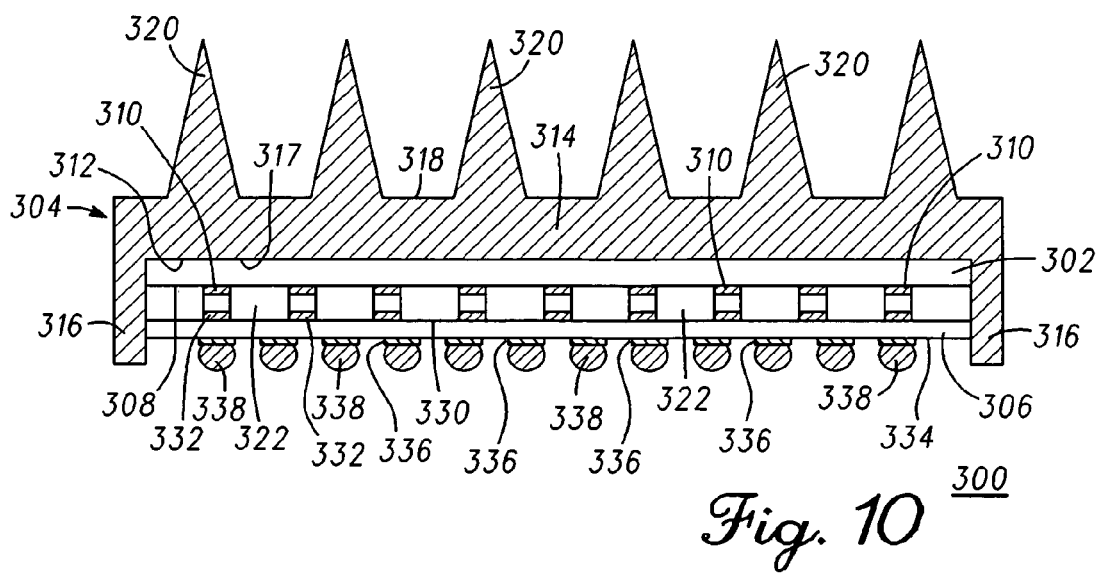
FIG. 10 is a cross-sectional side view of a semiconductor component in accordance with yet another embodiment of the present invention.

Referring now to FIG. 10, a cross-sectional side view of a semiconductor component 300 in accordance with another embodiment of the present invention is shown. Semiconductor component 300 comprises a semiconductor chip 302 coupled to a heatsink 304 and a ball grid array substrate 306 having solder balls bonded to a back surface. Semiconductor chip 302 has an active surface 308 on which bumped bond pads 310 are formed and a surface 312 suitable for mating with heatsink 304. Heatsink 304 comprises a base 314 having sidewalls 316. Base 314 has a chip mating surface 317 and a heat dissipation surface 318. Preferably, heat dissipation surface 318 has a plurality of pyramidally shaped fins 320 extending therefrom. By way of example, heatsink 304 is formed by injection molding using techniques described with reference to FIG. 2 for making heatsink 88; however, the bottom portion of the mold assembly includes means for forming fins 320.

Semiconductor chip 302 is coupled to a ball grid array substrate 306 via a liquid crystal polymer 322. Ball grid array substrate 306 has a top surface 330 having landing pads 332 and a bottom surface 334 having landing pads 336. Solder balls 338 are disposed on landing pads 336. Landing pads 332 are configured to mate with bumped bond pads 310 that are disposed on semiconductor chip 302. It should be noted that FIG. 10 shows bumped bond pads 310 after bonding with corresponding landing pads 332.

Liquid crystal polymer 322 is dispensed on top surface 330 of ball grid array substrate 306. Liquid crystal polymer 322 is partially cured at a temperature ranging from about 260° C. to about 280° C. for a time ranging from about 20 minutes to about 60 minutes under low pressure, e.g., about 100 psi (689 kPa). The partially cured liquid crystal polymer 322 is mated with semiconductor chip 302. The partial curing leaves liquid crystal polymer 322 tacky which promotes adhesion with ball grid array substrate 306. Semiconductor chip 302 is pressed against ball grid array substrate 306 and the combination of the semiconductor chip 302, liquid crystal polymer 322, and ball grid array substrate 306 undergo a heat treatment. The heat treatment bonds bumped bond pads 310 with landing pads 332 and cures liquid crystal polymer 322, thereby forming semiconductor component 300. It should be noted that heatsink 304 also serves as a lid to provide protection from physical and environmental stresses.

Figure 11:
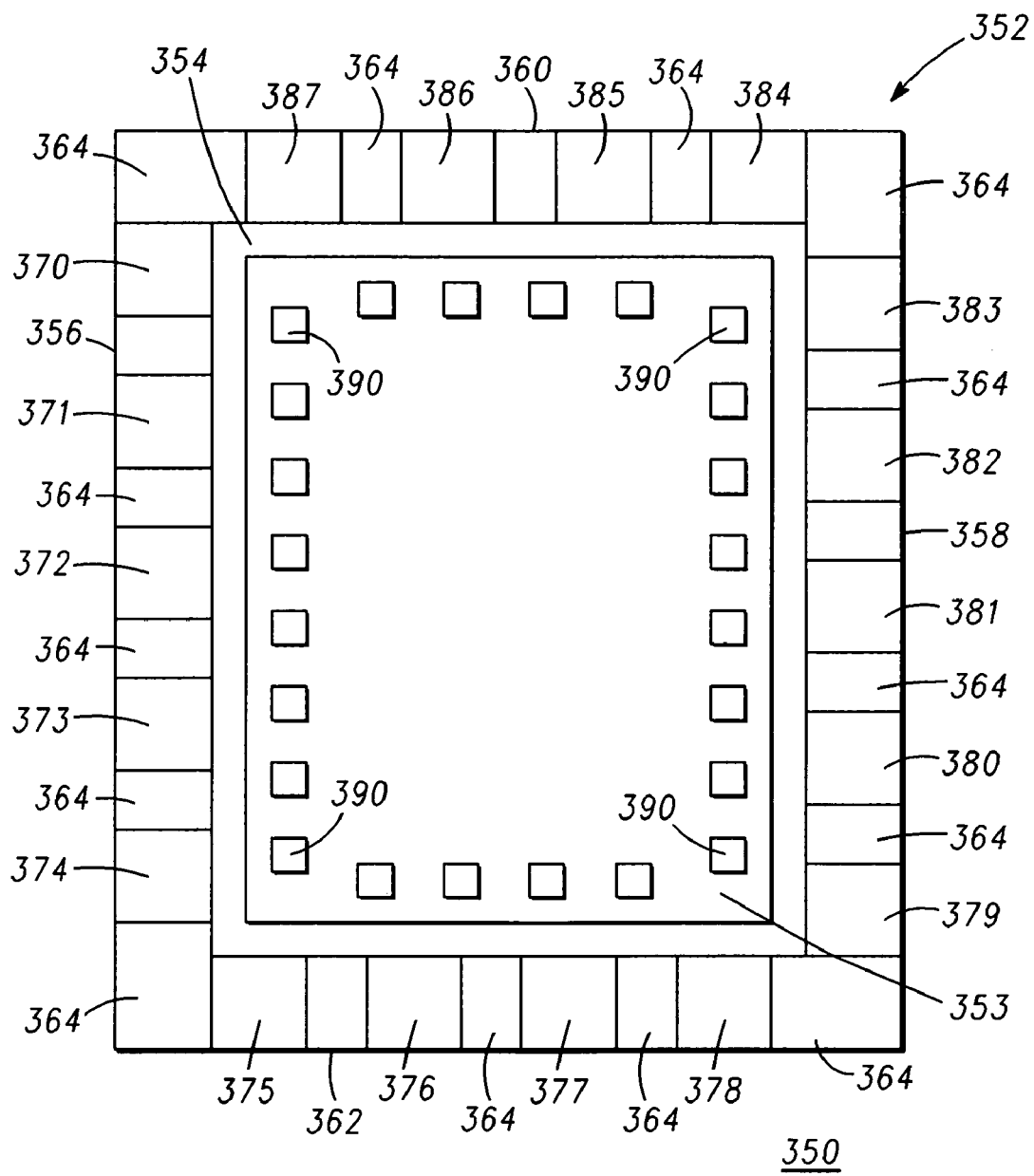
FIG. 11 is a top view of a semiconductor component in accordance with yet another embodiment of the present invention.

Referring now to FIG. 11, a top view of a semiconductor component 350 in accordance with another embodiment of the present invention is shown. Semiconductor component 350 includes a packaging substrate 352 having a semiconductor chip 353 mounted thereon. Packaging substrate 352 includes a heatsink 354 having opposing sides 356 and 358 and opposing sides 360 and 362. Although heatsink 354 is shown as a quadrilaterally shaped structure, this is not a limitation of the present invention. Heatsink 354 can have other geometric shapes.

Packaging substrate 352 includes a plurality of leadframe leads 370-387 coupled to heatsink 354 through a thermally conductive liquid crystal polymer 364. Prior to singulation, leadframe leads 370-387 are part of a leadframe (not shown) in which leadframe leads 370-374 and 379-383 are on opposing sides of the leadframe and leads 375-378 and 384-387 are on opposing sides of the leadframe. The number of leads and the number of leads per side of packaging substrate 352 are not a limitation of the present invention.

Liquid crystal polymer 364 is preferably dispensed on leadframe leads 370-387 and partially cured by heating to a temperature ranging from about 260° C. to about 280° C. for a time ranging from about 20 minutes to about 60 minutes under low pressure, e.g., about 100 psi (689 kPa). The partial curing leaves liquid crystal polymer 364 tacky or sticky. The partially cured liquid crystal polymer 364 is mated with heatsink 354. Because liquid crystal polymer 364 is tacky, it adheres to heatsink 354. Pressure is applied to either the leadframe, the heatsink, or both, and the liquid crystal polymer is cured by, for example, being heated to a temperature ranging from about 280° C. to about 300° C. for a time period ranging from about 20 minutes to about 60 minutes under low pressure, e.g., about 100 psi (689 kPa). Curing liquid crystal polymer 364 forms an assembly containing a plurality of packaging substrates 352, wherein each packaging substrate includes leadframe leads, liquid crystal polymer 364, and a heatsink 354.

The assembly is singulated to form individual packaging substrates 352. After singulation, leadframe leads 370-387 are preferably flush with the sides of heatsink 354, i.e., leadframe leads 370-374 are flush with side 356, leadframe leads 375-378 are flush with side 362, leadframe leads 384-387 are flush with side 360, and leadframe leads 379-383 are flush with side 358.

Semiconductor chip 353 is mounted on heatsink 354. The backside or non-active side of semiconductor chip 353 may be electrically coupled to heatsink 354 or it may be coupled to heatsink 354 through an insulating material such as, for example, liquid crystal polymer. Leadframe leads 370-387 are coupled to bond pads 390 disposed on semiconductor chip 353 using, for example, wirebonds. It should be understood that the choice of which leadframe leads 370-387 to couple to which bond pads 390 is a design choice. For the sake of clarity, the wirebonds have not been shown in FIG. 11.

It may be desirable to dispense a glob top material (not shown) over semiconductor chip 353 and leadframe leads 370-387. The glob top material can protect semiconductor chip 353 against mechanical and environmental stresses.

Optionally, heatsink 354 has fins similar to those described with reference to heatsink 304 shown in FIG. 10. In accordance with another option, a lid (not shown) may be formed over semiconductor chip 353, wherein a portion of the lid contacts a central portion of semiconductor chip 353.

By now it should be appreciated that a semiconductor component and a method for manufacturing the semiconductor component have been provided. An advantage of the present invention is that it provides a cost effective method for packaging a semiconductor chip using batch processing steps for forming the packaging substrate rather than using individual assembly steps. Manufacture of semiconductor packages in accordance with the present invention provides a high quality assembly that is repeatable. In addition, the present invention provides for various heatsinking finned structures for removing heat from the semiconductor devices.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising the steps of:

providing a heatsink having first and second major surfaces;

providing a leadframe having at least one leadframe lead;

disposing a liquid crystal polymer on a portion of the at least one leadframe lead;
partially curing the liquid crystal polymer; and
mating the liquid crystal polymer and the heatsink.

2. The method of claim 1, wherein the step of providing the heatsink includes providing the heatsink with a platform that serves as a die receiving area.

3. The method of claim 2, wherein the step of providing the heatsink includes contemporaneously forming the heatsink and the platform using an injection molding process.

4. The method of claim 1, wherein providing the heatsink includes forming at least one fin extending from the second major surface of the heatsink.

5. The method of claim 4, wherein the step of forming the at least one fin includes forming the at least one fin to have a quadrilateral shape.

6. The method of claim 5, wherein forming the at least one fin comprises forming at least three fins, wherein each of the at least three fins has a quadrilateral shape and are substantially parallel to each other.

7. The method of claim 6, wherein forming the at least one fin includes forming the at least one fin to have a pyramidal shape.

8. The method of claim 1, further including the step of further curing the liquid crystal polymer after mating the liquid crystal polymer and the heatsink.

9. The method of claim 8, wherein the step of disposing the liquid crystal polymer on the portion of the at least one leadframe lead includes dispensing the liquid crystal polymer on the at least one portion of the leadframe lead.

10. The method of claim 8, wherein the step of further curing the liquid crystal polymer includes fully curing the liquid crystal polymer.

11. The method of claim 8, wherein the step of providing the heatsink includes forming the heatsink using an injection molding process.

12. The method of claim 8, wherein the step of providing a leadframe having at least one leadframe lead includes providing a leadframe having first and second opposing sides spaced apart from each other by a central area, wherein a first leadframe lead extends from the first side into the central area and a second leadframe lead extends from the second side into the central area.

13. The method of claim 12, wherein the step of disposing the liquid crystal polymer includes disposing the liquid crystal polymer in a ring-shaped pattern having first and second opposing sides and third and fourth opposing sides, and wherein the first side of the ring-shaped pattern is disposed on the first leadframe lead and the second side of the ring-shaped pattern is disposed on the second leadframe lead.

14. The method of claim 13, wherein the first side of the ring-shaped pattern is disposed on a central portion of the first leadframe lead and the second side of the ring-shaped pattern is disposed adjacent an end of the ring-shaped pattern.

15. The method of claim 8, wherein the step of providing a leadframe having at least one leadframe lead includes providing a leadframe having first and second opposing sides spaced apart from each other by a central area, wherein a plurality of leadframe leads extends from the first side into the central area and a plurality of lead extends from the second side into the central area.

16. The method of claim 15, wherein the step of disposing the liquid crystal polymer includes disposing the liquid crystal polymer in a ring-shaped pattern having first and second opposing sides and third and fourth opposing sides, and wherein the first side of the ring-shaped pattern is disposed on the plurality of leadframe leads extending from the first side of the leadframe and the second side of the ring-shaped pattern is disposed on the plurality of leadframe leads extending from the second side of the leadframe.

17. The method of claim 16, wherein the step of providing a leadframe having at least one leadframe lead includes providing the leadframe having third and fourth opposing sides spaced apart from each other by the central area, wherein a plurality of leadframe leads extends from the third side into the central area and a plurality of leadframe leads extends from the fourth side into the central area, and wherein the step of disposing the liquid crystal polymer includes disposing the third side of the ring-shaped pattern on the plurality of leadframe leads extending from the third side and disposing the fourth side of the ring-shaped pattern on the plurality of leadframe leads extending from the fourth side.

18. The method of claim 8, further including the steps of:
providing a semiconductor chip having first and second major surfaces, wherein a gate structure is formed over the first major surface; and
coupling the first major surface of the semiconductor chip with the first major surface of the heatsink.

19. The method of claim 18, wherein the step of providing the semiconductor chip includes forming a metallization system on the first major surface of the semiconductor chip and wherein the step of coupling the first major surface of the semiconductor chip with the first major surface of the heatsink comprises soldering the semiconductor chip to the first major surface of the heatsink.

20. The method of claim 19, wherein the metallization system comprises one of a tin-nickel-gold metallization system or a tin-nickel-silver metallization system.

21. The method of claim 18, further including coupling a metal clip to the second side of the semiconductor chip and to a first leadframe lead of the plurality of leadframe leads.

22. The method of claim 21, further including the step of placing a lid over the semiconductor chip, wherein a portion of the lid is coupled to the metal clip.

23. The method of claim 21, wherein the step of providing the semiconductor chip includes forming a metallization system on the second major surface of the semiconductor chip and soldering the metal clip to the metallization system on the second major surface of the semiconductor chip.

24. The method of claim 23, wherein the metallization system on the second major surface of the semiconductor chip comprises aluminum with a nickel-gold alloy disposed thereon.

25. The method of claim 18, further including electrically coupling the gate structure to a second leadframe lead of the plurality of leadframe leads.

26. The method of claim 25, further including the step of soldering the lid to the semiconductor chip.

27. The method of claim 8, further including the step of coupling at least one other semiconductor chip to the heatsink.

28. The method of claim 27, wherein the step of coupling the at least one other semiconductor chip to the heatsink includes coupling a switching chip to the heatsink and coupling a mixed signal integrated circuit to the heatsink.

29. A method for manufacturing a semiconductor component, comprising the steps of:
forming a plurality of heatsinks, each heatsink of the plurality of heatsinks having first and second major surfaces;

providing a leadframe having a plurality of leadframe leads;

disposing a liquid crystal polymer on the plurality of leadframe leads;

partially curing the liquid crystal polymer;

coupling the leadframe to the plurality of heatsinks through the partially cured liquid crystal polymer to form a packaging frame comprising a plurality of packaging substrates; and singulating the packaging frame to separate the plurality of packaging substrates from each other.

30. The method of claim 29, wherein the step of forming the heatsink comprises using an injection molding process.

31. The method of claim 30, wherein the step of forming the heatsink comprises forming the heatsink having a quadrilateral shape.

32. The method of claim 30, wherein the step of disposing the liquid crystal polymer on the plurality of leadframe leads comprises disposing the liquid crystal polymer in a quadrilateral ring-shaped pattern.

33. The method of claim 29, further including the step of further curing the liquid crystal polymer.

34. The method of claim 33, further including coupling a semiconductor chip to the heatsink, electrically coupling the semiconductor chip to at least one leadframe lead of the plurality of leadframe leads, and disposing a glob top material over the semiconductor chip.

35. A method for manufacturing a semiconductor component, comprising the steps of:

providing a heatsink having first and second major surfaces;

providing a ball grid array substrate having a first major surface and a second major surface, the second major surface having solder balls coupled thereto;

disposing a liquid crystal polymer on a portion of the first major surface of the ball grid array substrate;

partially curing the liquid crystal polymer;

mating a first major surface of a semiconductor chip to the liquid crystal polymer; and mating a second major surface of the semiconductor chip to the heatsink.

36. The method of claim 35, wherein providing the heatsink includes providing fins extending from the second major surface of the heatsink.

37. The method of claim 36, wherein partially curing the liquid crystal polymer includes partially curing the liquid crystal polymer at a temperature ranging from about 260° C. to about 280° C. for a time ranging from about 20 minutes to about 60 minutes.

38. The method of claim 37, further including curing the liquid crystal polymer after the step of mating the first major surface of a semiconductor chip to the liquid crystal polymer.

39. A semiconductor component, comprising:

a heatsink having first and second major surfaces;

a liquid crystal polymer disposed on the first major surface of the heatsink, the liquid crystal polymer having a first side;

first and second leadframe leads disposed on first and second portions of the liquid crystal polymer, respectively;

a semiconductor chip having an active surface and a back surface, the active surface coupled to the heatsink;

an interconnect coupling the semiconductor chip to the first leadframe lead; and a clip coupling the back surface to the second leadframe lead.

40. The semiconductor component of claim 39, wherein a portion of the first leadframe lead extends beyond the first side of the liquid crystal polymer.

41. The semiconductor component of claim 40, wherein the liquid crystal polymer forms a ring-shaped pattern on the first major surface of the heatsink, the ring-shaped pattern comprising first, second, third, and fourth sides, wherein the first and second sides are opposite each other and the third and fourth sides are opposite each other, and wherein the first side includes the first portion of the liquid crystal polymer and the second side includes the second portion of the liquid crystal polymer.

42. The semiconductor component of claim 41, further including a lid coupled to the first and second leadframe leads through an electrically insulating material.

43. The semiconductor component of claim 42, wherein the lid contacts the clip.

44. The semiconductor component of claim 43, further including at least one fin extending from the second major surface of the heatsink.

* * * * *